(12) United States Patent
Fan et al.

(10) Patent No.: US 7,212,400 B2
(45) Date of Patent: May 1, 2007

(54) FIXING APPARATUS FOR MOTHERBOARD

(75) Inventors: Chen-Lu Fan, Tu-cheng (TW); Chien-Chung Liu, Tu-cheng (TW); Li-Ping Chen, Tu-cheng (TW)

(73) Assignee: Hon Hai Precision Industry Co., Ltd., Tu-Chen, Taipei Hsien (TW)

( * ) Notice: Subject to any disclaimer, the term of this patent is extended or adjusted under 35 U.S.C. 154(b) by 247 days.

(21) Appl. No.: 10/991,122

(22) Filed: Nov. 17, 2004

(65) Prior Publication Data

US 2005/0276007 A1    Dec. 15, 2005

(30) Foreign Application Priority Data

Jun. 15, 2004   (CN)   ................ 2004 2 0047362

(51) Int. Cl.
*G06F 1/16* (2006.01)

(52) U.S. Cl. ............ 361/684; 361/752; 361/808; 174/535; 174/138 G

(58) Field of Classification Search .............. 361/683, 361/684, 748, 752, 808, 753, 742; 174/520, 174/535, 138 D, 50, 138 G, 138 E
See application file for complete search history.

(56) References Cited

U.S. PATENT DOCUMENTS

| | | | |
|---|---|---|---|
| 6,399,887 B1 * | 6/2002 | Lin ................ | 174/138 D |
| 6,424,537 B1 * | 7/2002 | Paquin et al. ........... | 361/752 |
| 6,424,538 B1 * | 7/2002 | Paquin ................ | 361/752 |
| 7,072,176 B2 * | 7/2006 | Lin et al. ............ | 361/685 |
| 2004/0120108 A1 * | 6/2004 | Wang ................ | 361/683 |
| 2004/0223307 A1 * | 11/2004 | Chen et al. ............ | 361/748 |
| 2005/0078460 A1 * | 4/2005 | Richard et al. ......... | 361/753 |

FOREIGN PATENT DOCUMENTS

| | | |
|---|---|---|
| CN | 99216650.0 | 9/2000 |
| CN | 00201452.1 | 12/2000 |
| TW | 379818 | 1/2000 |
| TW | 383713 | 2/2000 |
| TW | 557088 | 1/2003 |
| TW | 527070 | 4/2003 |

* cited by examiner

Primary Examiner—Lisa Lea-Edmonds
(74) Attorney, Agent, or Firm—Morris Manning & Martin LLP; Tim Tingkang Xia, Esq.

(57) ABSTRACT

A fixing apparatus is for fixing a motherboard (60) in a chassis (20). The chassis includes a supporting board (30). The supporting plate includes a number of clips (36, 38), and a screw hole (391). The motherboard (60) defines a number of through holes (62) corresponding to a number of standoff (40) disposed on the supporting plate, a number of apertures (64), and a fixing hole (66). The through holes each include a circular hole (622), and a slot (624). The standoffs each comprise a head (42), a neck (44), and a base (46). The clips each include a shoulder (367, 387), and a catch (366, 386). The standoffs and the clips engage the through hole and the apertures of the supporting plate to attach the motherboard in the chassis. A stud extends through the fixing hole and engages the screw hole to secure the motherboard in the chassis.

21 Claims, 4 Drawing Sheets

FIXING APPARATUS FOR MOTHERBOARD

BACKGROUND OF THE INVENTION

1. Field of the Invention

The present invention relates to fixing apparatuses for securing a motherboard in an electronic device, and more particularly to an apparatus which can quickly and readily mounting motherboard therein and detaching therefrom.

2. Description of the Related Art

During assembly of a typical personal computer, a motherboard must be fastened to a computer frame or chassis. The motherboard is conventionally mounted to the computer chassis using fasteners such as screws or bolts. China Pats, Nos. 98241276.2 and 00201452.1 each disclose such an arrangement. Coinciding positioning holes are defined in the motherboard and the chassis. The fasteners are inserted into the positioning holes and tightened one by one, thereby securing the motherboard to the chassis.

When installing or removing the motherboard, tightening or removing the fasteners is laborious and time-consuming. In addition, a tool such as a screwdriver or a wrench is usually required. Moreover, the motherboard is prone to be damaged if the tool slips during manipulation of the fasteners.

Thus, a fixing apparatus for a motherboard which solves the above-mentioned problems is strongly desired.

SUMMARY OF THE INVENTION

Accordingly, an object of the present invention is to provide a fixing apparatus which allows quickly and readily attachment and removal of a motherboard to and from and a chassis of an electronic device.

To achieve the above-mentioned object, a fixing apparatus in accordance with the preferred embodiment of the present invention is used for fixing a motherboard in a chassis of an electronic device. The fixing apparatus comprises a supporting plate disposed in the chassis and a plurality of standoffs. The motherboard comprises a plurality of through holes, a plurality of apertures, and a fixing hole. The supporting plate comprises a first clip, a second clip, and a screw hole. The through holes each comprise a circular hole, and a slot. The standoffs each comprise a head, a base, and a neck disposed between the head and the base. The clips each comprise a shoulder, and a catch. The bases of the standoffs and the shoulders of the clips support the motherboard. The necks of the standoffs engage the slots of the through holes and the catches of the clips engage the apertures. A stud extends through the fixing hole and engages the screw hole to secure the motherboard in the chassis.

Other objects, advantages and novel features of the present invention will be drawn from the following detailed description of a preferred embodiment of the present invention with attached drawings, in which:

DETAILED DESCRIPTION OF THE INVENTION

Figure 1:
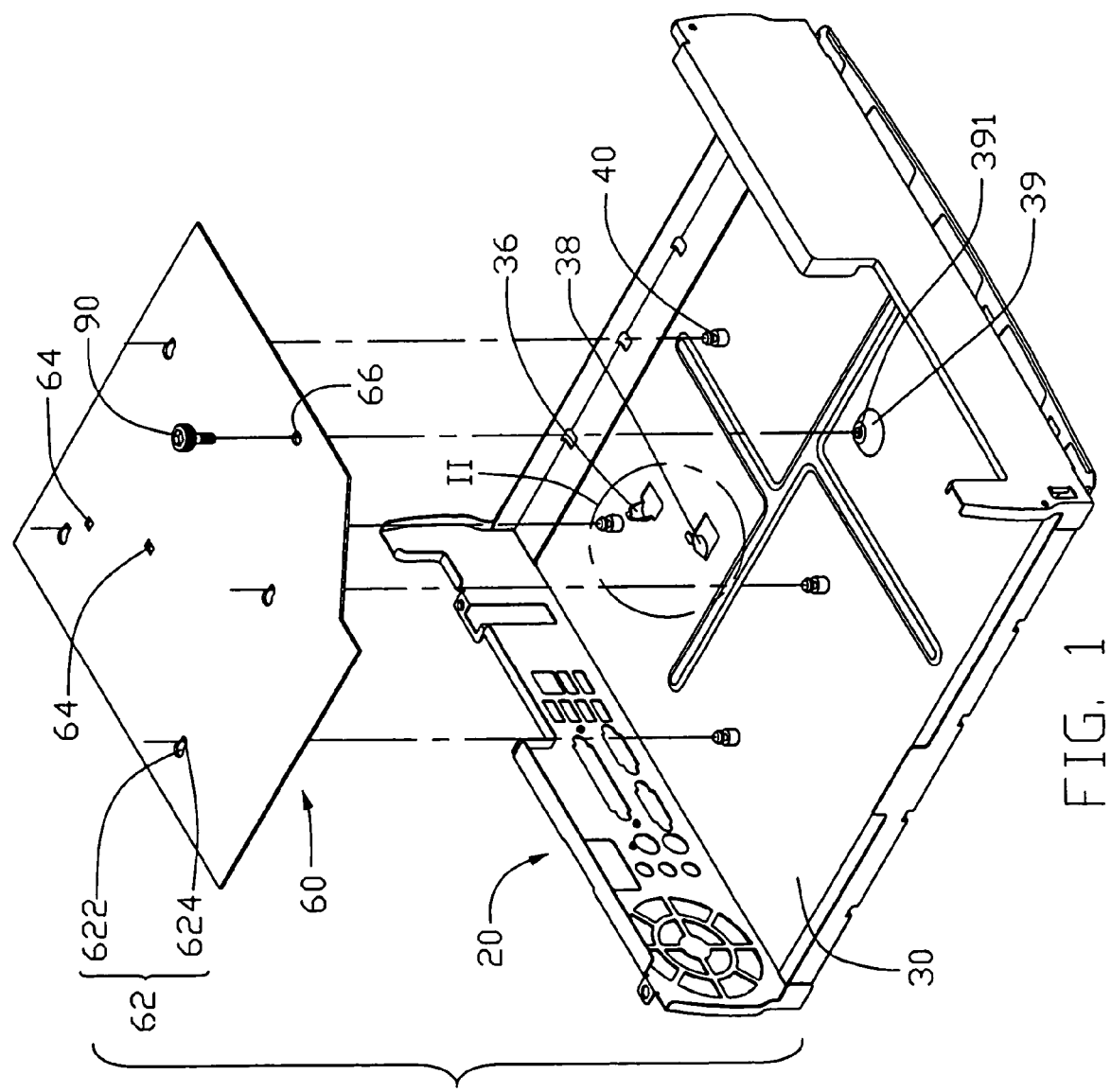
FIG. 1 is an exploded, isometric view of a motherboard fixing apparatus in accordance with the present invention, together with a motherboard, a chassis, a plurality of standoff.

Referring to FIG. 1, a fixing apparatus for motherboard in accordance with the preferred embodiment of the present invention is used for securing a motherboard 60 in an electronic chassis 20. The fixing apparatus comprises a supporting plate 30 assembled in the electronic chassis 20, and a plurality of standoffs 40.

Figure 2:
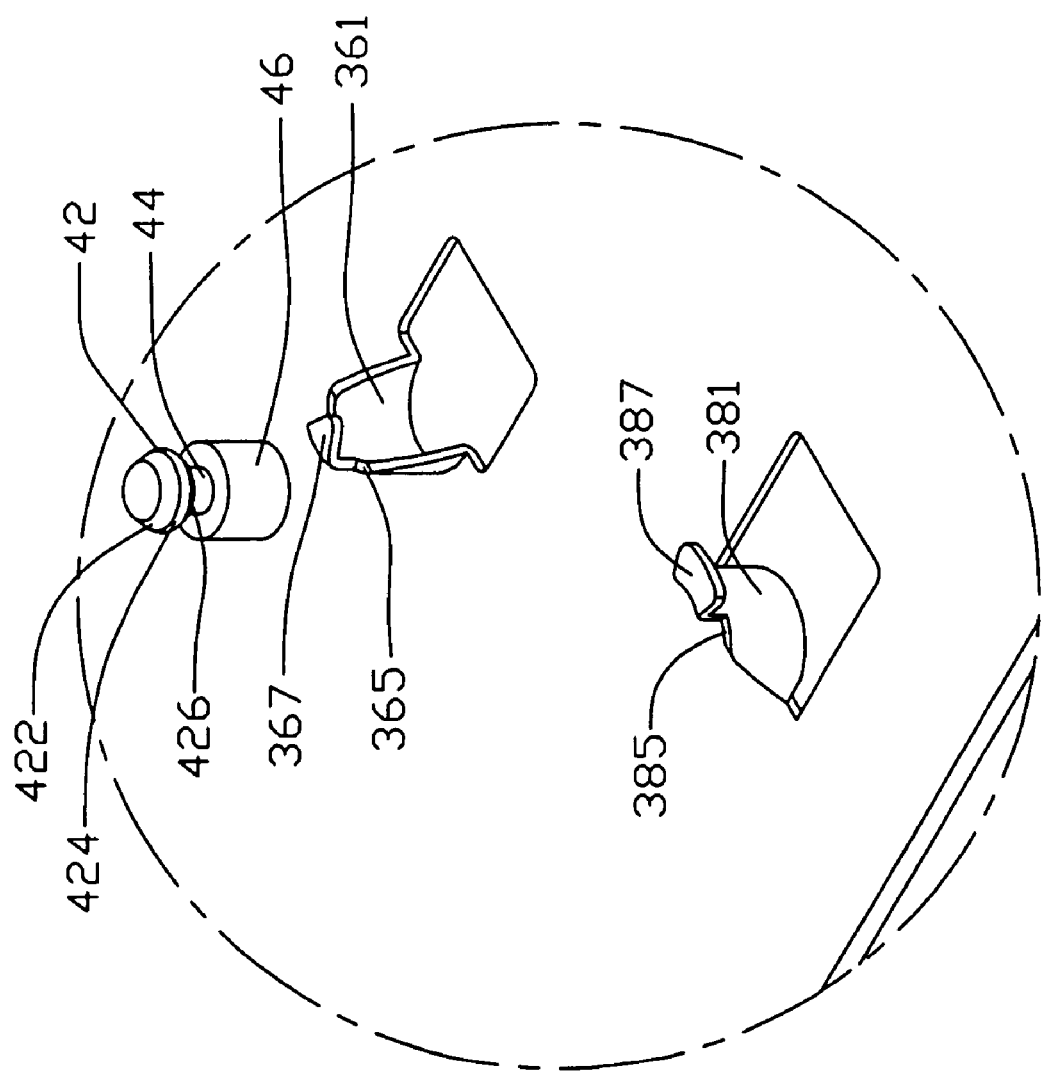
FIG. 2 is an enlarged view of an encircled portion II of FIG. 1.
Figure 3:
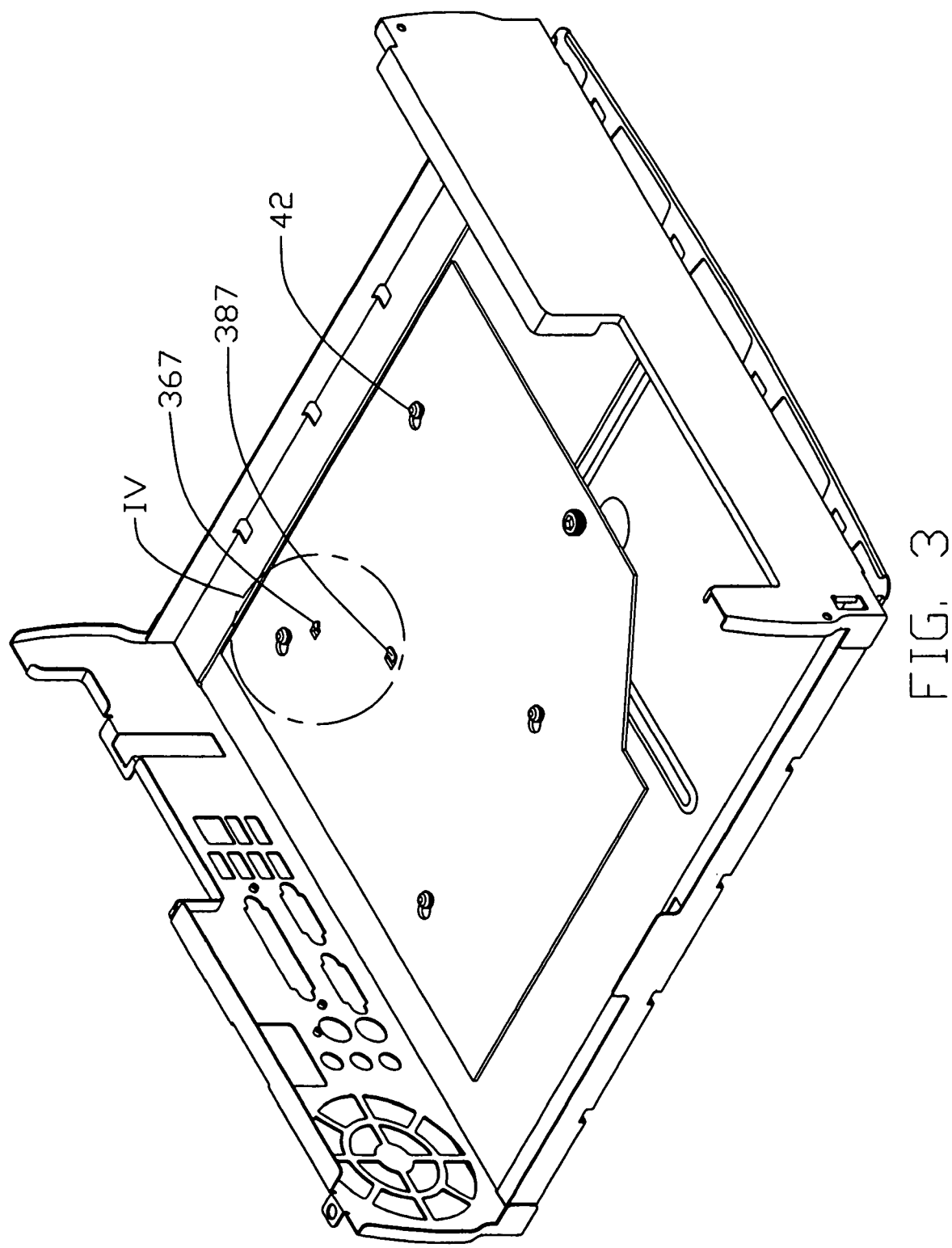
FIG. 3 is an enlarged assembled view of FIG. 1.

Referring also to FIG. 2, the supporting plate 30 is alttached to the chassis 20 or integrated with the chassis 20, for supporting the motherboard 60 thereon. A first clip 36 and a second clip 38 extend upwardly from the supporting plate 30. The first clip 36 comprises a convex sidewall 361, and a first upright catch 367 extending upwardly from a top portion of the sidewall 361. A pair of first shoulders 365 is formed at junctions between the catch 367 and the sidewall 361. A second clip 38 comprises a concave sidewall 381, and a second upright catch 387 extending upwardly from atop portion of the sidewall 381. A pair of second shoulders 385 is formed at junctions between the catch 387 and the sidewall 381. The first and the second catch 367 and 387 both have an inverted L-shaped profile. The supporting plate 30 further comprises a bulge 39 extending upwardly therefrom. A screw hole 391 is defined in a top of the bulge 39.

The standoffs 40 are made of conductive materials. Each standoff 40 comprises a head 42, a base 46, and a neck 44 disposed between the head 42 and the base 46. The head 42 comprising a diameter increasing guiding portion 422, a diameter reduced guiding portion 426 extending downwardly from the diameter increasing guiding portion 422. A critical portion 424 is formed between the diameter increasing guiding portion 422 and the diameter reduced guiding portion 426. A diameter of the critical portion 424 is larger than that of the diameter increasing guiding portion 422 and the diameter reduced guiding portion 426. The neck 44 and the base 46 each have a cylindrical configuration. A diameter of the neck 44 is smaller than that of the base 46 and that of the head 42.

The motherboard 60 defines a plurality of through holes 62, a plurality of rectangular apertures 64, and a fixing hole 66 therein. Each the through hole 62 comprises a circular hole 622, and a slot 624 extending from the circular hole 622. A diameter of the circular hole 622 is larger than that of the critical portion 424 and less than that of the base 46 of the standoff 40. A width of the slot 624 is larger than the diameter of the neck 44 and less than the diameter of the base 46 and a diameter of the diameter reduced guiding portion 426 of the standoff 40. The rectangular apertures 64 are configured to correspond the first and second clip 36, 38 of the supporting plate 30. The fixing hole 66 is configured to correspond to the screw hole 391 of the supporting plate 30 for engaging with a stud 90.

Figure 4:
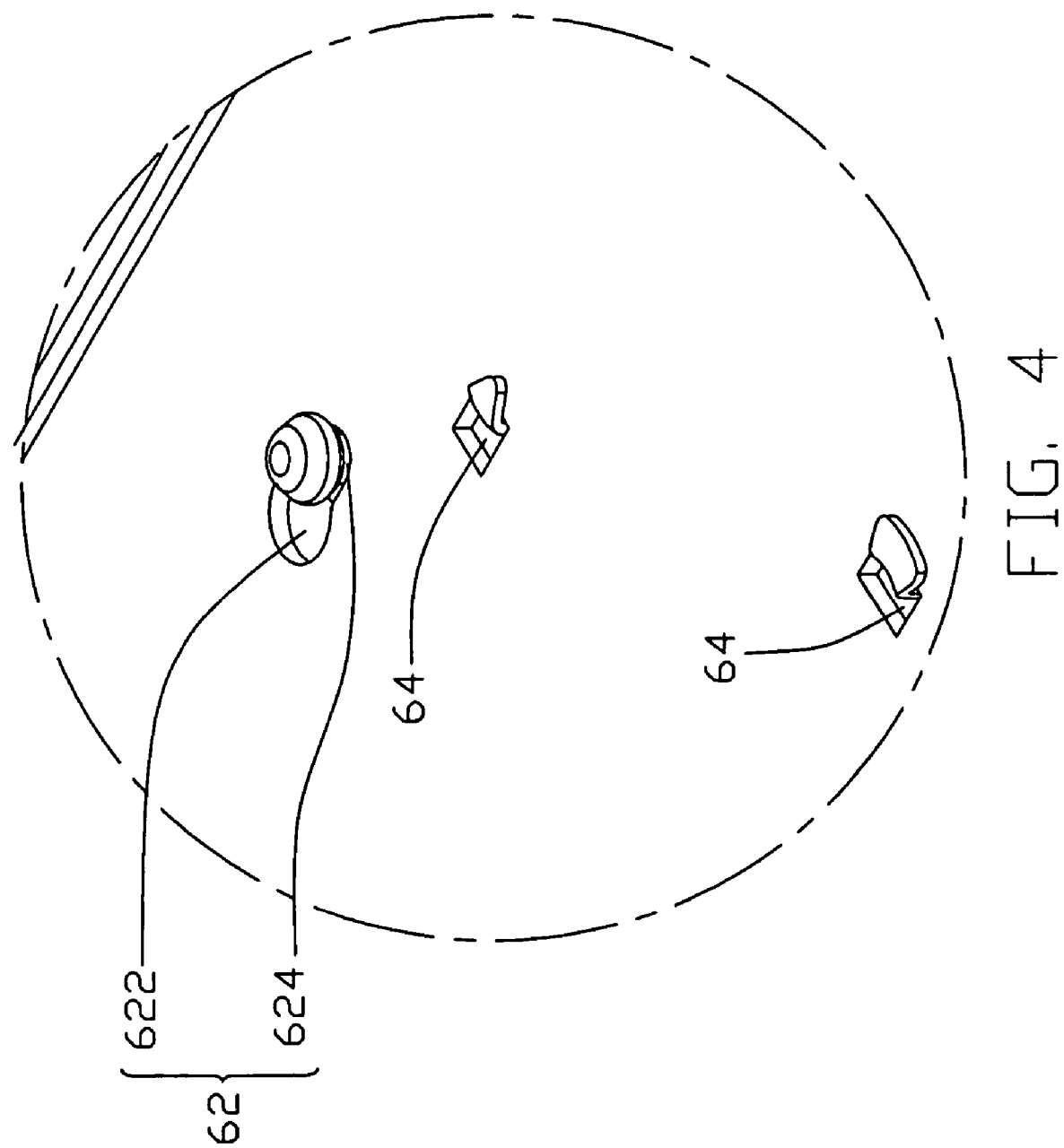
FIG. 4 is an enlarged view of an encircled portion V of FIG. 3.

Referring also to FIG. 4, in assembly of the fixing apparatus, the standoffs 40 are placed upwardly on the supporting plate 30 of the chassis 20. The motherboard 60 is attached to the supporting plate 30, with the heads 42 of standoffs 40 extending through the circular holes 622 and the first and second clips 36 and 38 extending through the rectangular apertures 64. Then the motherboard 60 is moved parallel to the supporting plate 30. The motherboard 60 is located on the supporting plate 30, with the slots 624 of the through holes 62 engaging the necks 44 of the standoffs 40 and the first and second catch 367,387 engaging with the apertures 64. At the same time, the motherboard 60 is supported on the bases 46 of the standoffs 40 and the shoulders 365 and 385 of the first and second clip 36 and 38.

The stud 90 extends through the fixing hole 66 of the motherboard 60 and engages in the screw hole 391 of the supporting plate 30 to secure the motherboard 60 in the chassis 20.

In disassembly, the stud 90 is unscrewed. The motherboard 60 is drawn to move the neck 44 of each standoff 40 from the slot 624 to the circular hole 622 of the corresponding through hole 62 and the first and second catch 367, 387 from the apertures 64 thereof. Thus the motherboard 60 is easily detached from the supporting plate 30.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A fixing apparatus for securing motherboards in a chassis, the fixing apparatus comprising:
   a motherboard defining a plurality of through holes, at least one aperture, and a fixing hole;
   a supporting plate adapted to be disposed in the chassis, the supporting plate comprising at least one clip extending upwardly therefrom and a screw hole defined therein, said clip comprising a shoulder supporting the motherboard and a catch engaging said aperture;
   a plurality of standoffs displaced on the supporting plate, each standoff comprising a base supporting the motherboard, and a neck engaging the through hole of the motherboard;
   a stud extending through the fixing hole and engaging the screw hole to secure the motherboard.

2. The fixing apparatus as described in claim 1, wherein the neck and the base of the standoff have a cylindrical configuration, a diameter of the neck is smaller than that of the base.

3. The fixing apparatus as described in claim 2, wherein the standoff further comprises a head disposed on a top of the neck, the head comprises a diameter increasing portion, a diameter reduced portion, and a critical portion disposed therebetween.

4. The fixing apparatus as described in claim 3, wherein each through hole of the motherboard comprises a circular hole, and a slot extending from the circular hole.

5. The fixing apparatus as described in claim 4, wherein a diameter of the circular hole is larger than that of the critical portion and less than that of the base of the standoff.

6. The fixing apparatus as described in claim 4, wherein a width of the slot is larger than a diameter of the neck and less than a diameter of the diameter reduced portion of the standoff.

7. The fixing apparatus as described in claim 1, wherein the standoffs are made of conductive materials.

8. The fixing apparatus as described in claim 1, wherein said clip comprises a sidewall, the catch upwardly forms in a top portion of the clip.

9. The fixing apparatus as described in claim 8, wherein the sidewall has a concave profile.

10. The fixing apparatus as described in claim 8, wherein the sidewall has a convex profile.

11. The fixing apparatus as described in claim 1, wherein a bulge extends upwardly from the supporting plate, the screw hole is defined in the bulge.

12. A fixing apparatus for securing a motherboard comprising:
   a chassis comprising a supporting plate, the supporting plate comprising a plurality of clips and a bulge extending upwardly therefrom, each clip comprising a sidewall, a catch formed in a top of the sidewall, and at least one shoulder formed between the sidewall and the catch, a screw hole being defined in a top of the bulge;
   a motherboard defining a plurality of apertures corresponding to the clips and a fixing hole corresponding to the screw hole; and
   a fastener securing the motherboard to the supporting plate;
   wherein the motherboard is supported on the shoulders of the clip and the bulges, the catches of the clips engages the apertures, the fastener extends trough the fixing hole and engages the screw hole to secure the motherboard in the chassis.

13. The fixing apparatus assembly as described in claim 12, further comprises a plurality of standoffs, the motherboard further comprises a plurality of through holes defined therein, the through hole comprises a circular hole, and a slot extending from the circular hole.

14. The fixing apparatus assembly as described in claim 13, wherein the standoff comprises a head, a base, and a neck disposed therebetween.

15. The fixing apparatus as described in claim 14, wherein the neck and the base of the standoff have a cylindrical configuration, a diameter of the neck is smaller than that of the base.

16. The fixing apparatus as described in claim 14, wherein the head comprises a diameter increasing portion, a diameter reduced portion, and a critical portion disposed therebetween.

17. The fixing apparatus as described in claim 16, wherein a diameter of the circular hole is larger than that of the critical portion and less than that of the base of the standoff.

18. The fixing apparatus as described in claim 17, wherein a width of the slot is larger than a diameter of the neck and less than a diameter of the diameter reduced portion of the standoff.

19. The fixing apparatus as described in claim 13, wherein the standoffs are made of conductive materials.

20. A fixing apparatus for securing a circuit board to an electronic chassis comprising:
   a supporting plate defined in said chassis, and comprising at least one clip extending from said supporting plate, said at least one clip defining a catch formed at an end thereof and said catch pointing along a first direction, and a stud to fix said circuit board to a bulge defined on said supporting plate so as to confine movement of said circuit board in said first direction; wherein
   said circuit board defines at least one aperture corresponding to said at least one clip to allow said catch passing through along a second direction, and said circuit board is confined by said catch in said second direction after said catch passes through said at least one aperture and said circuit board moves in a reverse direction to said first direction next to said catch.

21. The fixing apparatus as described in claim 20, further comprising a plurality of standoffs formed on said supporting plate to support said circuit board thereon, said plurality of standoffs engage able with a plurality of through holes of said circuit board respectively when said circuit board is supported by said plurality of standoffs.

* * * * *